(12) United States Patent
Hou et al.

(10) Patent No.: US 11,221,801 B2
(45) Date of Patent: Jan. 11, 2022

(54) DATA WRITING METHOD AND STORAGE CONTROLLER

(71) Applicant: Acer Incorporated, New Taipei (TW)

(72) Inventors: Guan-Yu Hou, New Taipei (TW); Tz-Yu Fu, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/999,044

(22) Filed: Aug. 20, 2020

(65) Prior Publication Data
US 2021/0223992 A1 Jul. 22, 2021

(30) Foreign Application Priority Data
Jan. 22, 2020 (TW) .................. 109102562

(51) Int. Cl.
*G06F 3/06* (2006.01)

(52) U.S. Cl.
CPC .......... *G06F 3/0659* (2013.01); *G06F 3/0619* (2013.01); *G06F 3/0634* (2013.01); *G06F 3/0653* (2013.01); *G06F 3/0679* (2013.01)

(58) Field of Classification Search
CPC .... G06F 3/0659; G06F 3/0634; G06F 3/0679; G06F 3/0619; G06F 3/0653
See application file for complete search history.

(56) References Cited

U.S. PATENT DOCUMENTS

| | | | |
|---|---|---|---|
| 2016/0077749 A1* | 3/2016 | Ravimohan | G06F 3/0688 711/103 |
| 2018/0260331 A1* | 9/2018 | Kotte | G06F 12/0246 |
| 2019/0102083 A1 | 4/2019 | Dusija et al. | |
| 2020/0301612 A1* | 9/2020 | Jin | G06F 3/0656 |

FOREIGN PATENT DOCUMENTS

| | | |
|---|---|---|
| CN | 107967121 | 4/2018 |
| TW | 201814489 | 4/2018 |

* cited by examiner

*Primary Examiner* — Hiep T Nguyen
(74) *Attorney, Agent, or Firm* — JCIPRNET

(57) ABSTRACT

A data writing method and a storage controller are provided. The data writing method includes: selecting a plurality of first dies and a plurality of second dies from a plurality of dies of the flash memory module, receiving a writing command and determining an amount of write data corresponding to the writing command, and when the amount of write data is greater than a threshold, writing in a pSLC mode the write data into the second dies.

10 Claims, 1 Drawing Sheet

DATA WRITING METHOD AND STORAGE CONTROLLER

CROSS-REFERENCE TO RELATED APPLICATION

This application claims the priority benefit of Taiwan patent application serial no. 109102562, filed on Jan. 22, 2020. The entirety of the above-mentioned patent application is hereby incorporated by reference here and made a part of this specification.

BACKGROUND

Technical Field

The disclosure relates to a data writing method and a storage controller, and particularly relates to a data writing method that increases good experience time of a user and a storage controller.

Description of Related Art

In order to save costs, a quad level cell (QLC) solid state drive (SSD) has been developed, while the QLC SSD is criticized for its service life and performance. The more the electrons in one divided storage unit of an NAND flash memory, the finer the way to control the number of electrons entering a floating gate during a writing operation, and the more the time consumed by the writing operation. Therefore, people skilled in the art should be dedicated to the way to improve the performance of the QLC SSD.

SUMMARY

The disclosure provides a data writing method and a storage controller to increase good experience time of a user during a writing operation of an SSD.

In an embodiment of the disclosure, a data writing method is provided, and the data writing method includes: selecting a plurality of first dies and a plurality of second dies from a plurality of dies of a flash memory module, receiving a writing command and determining an amount of write data corresponding to writing command, and when the amount of write data is greater than a threshold, writing in a pseudo single level cell (pSLC) mode the write data into the second dies.

In an embodiment of the disclosure, a storage controller coupled to a host and a flash memory module is provided. The storage controller includes a processor. The processor selects a plurality of first dies and a plurality of second dies from a plurality of dies of the flash memory module, receives a writing command from the host and determines an amount of write data corresponding to the writing command, and writes in a pSLC mode the write data into the second dies when the amount of write data is greater than a threshold.

In view of the above, in the data writing method and the storage controller provided in one or more embodiments of the disclosure, the first dies and the second dies are selected from the dies of the flash memory module, and the write data are written in the pSLC mode into the second dies when the amount of the write data is greater than the threshold. In comparison with writing in the pSLC mode the write data into all of the dies of the flash memory module, in the data writing method and the storage controller provided in one or more embodiments of the disclosure, the writing operation in the pSLC mode is performed on the second dies of the flash memory module, so as to increase the good experience time of a user.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
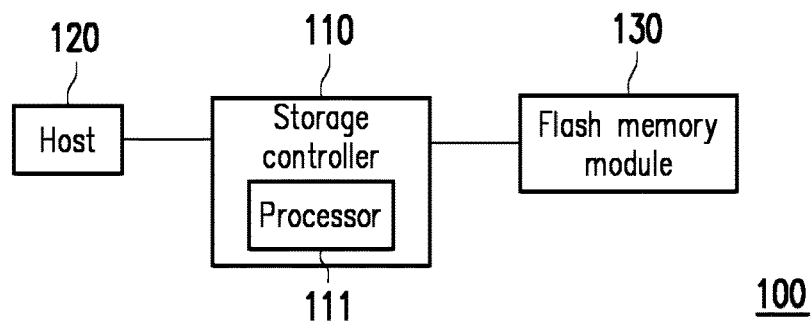
FIG. 1 is a block diagram of a data writing system according to an embodiment of the disclosure.

FIG. 1 is a block diagram of a data writing system according to an embodiment of the disclosure.

With reference to FIG. 1, a data writing system 100 provided in an embodiment of the disclosure includes a storage controller 110, a host 120, and a flash memory module 130, and the host 120 and the flash memory module 130 are coupled to the storage controller 110. The storage controller 110 includes a processor 111. In an embodiment, the storage controller 110 and the flash memory module 130 may be included in a storage device such as an SSD, but the disclosure is not limited thereto. The host 120 is, for instance, an electronic device, such as a personal computer, a notebook computer, a tablet computer, a smartphone, and so on. In an embodiment, the flash memory module 130 is, for instance, a QLC flash memory module, but the disclosure is not limited thereto. In other embodiments, the flash memory module 130 may also be a triple level cell (TLC) module or a multiple level cell (MLC) module.

Figure 2:
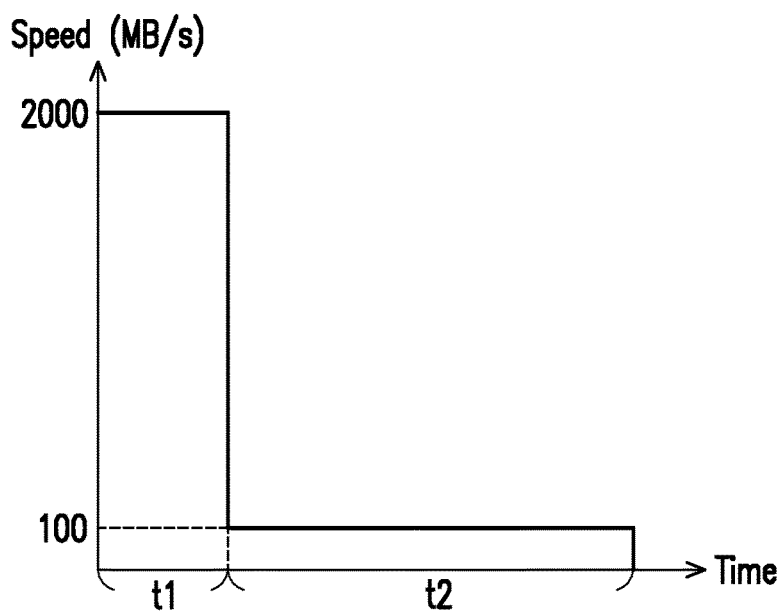
FIG. 2 is a schematic diagram of a continuous writing speed and a time when all dies of a flash memory module are configured to be pSLCs according to an embodiment of the disclosure.

In an embodiment, the processor 111 may configure all dies (e.g., 16 dies) of the QLC flash memory module 130 to be in a pSLC mode. FIG. 2 is a schematic diagram of a continuous writing speed and a time when all dies of a flash memory module are configured to be pSLCs according to an embodiment of the disclosure. With reference to FIG. 2, although the writing speed in the pSLC mode may reach 2000 MB/s in a time interval t1, if pSLC space (e.g., about 1/16 of the actual QLC space) is already full of the write data, the write data are continuously written in a QLC mode. At this time, for instance, in a time interval t2, the writing speed in the QLC mode is reduced to 100 MB/s. Said descending writing speed significantly affects the user experience. For instance, the system may run slowly or lag when running applications or performing system operations.

In an embodiment, the processor 111 selects a plurality of first dies and a plurality of second dies from a plurality of dies of the flash memory module 130. The processor 111 may receive a writing command from the host 120 and determine the amount of write data corresponding to the writing command. When the amount of write data is greater than a threshold, the processor 111 writes in the pSLC mode the write data into the second dies. When the amount of write data is less than or equal to the threshold, the processor 111 writes in the pSLC mode the write data into the first dies and the second dies. When part of the pSLC space corresponding to the second dies is already filled with one portion of the write data, the processor 111 writes in the QLC mode the remaining portion of write data into storage space other than the pSLC space in the second dies.

For instance, when the QLC flash memory module 130 has 16 dies, the processor 111 may reserve 2 dies (i.e., the first dies) as QLC dies and performs the writing operation in the pSLC mode on 14 dies (i.e., the second dies). If the write data are sequential write data of a significant amount (e.g., greater than 1 GB), the processor 111 writes in the pSLC mode the write data into the 14 dies. If the amount of write data is less than 1 GB (e.g., during benchmark testing), the writing operation needs to be performed at the highest performance level, and thus the processor 111 writes in the pSLC mode the write data into all of the 14 dies to prevent the user from complaining about the poor writing performance.

The following is a formula expressing extension of good experience time of a user by performing the writing operation in the pSLC mode on some dies of the flash memory module 130: assuming that the writing speed in the full-speed pSLC mode is x, then the writing speed in the QLC mode is x/20 (the writing speed in the QLC mode is about $\frac{1}{20}$ of the writing speed in the pSLC mode); the percentage of the reserved QLC dies is y ($y=\frac{2}{16}$ in the above example); the equivalent writing speed $z=(1-y)\,xy*x/20$; the time multiple ExT. which represents the extension of the good experience time of the user, is $=x/z=1/(1-11y/20)$.

Table 1 below shows the actual test table of the time and the equivalent writing speed (MB/s) corresponding to different numbers of the reserved QLC dies of the flash memory module 130 of different capacities to extend the good experience time of a user.

In an embodiment, the processor 111 may also obtain the writing speed and determine the number of first dies and the number of second dies according to the writing speed, the capacity of the flash memory module 130, and the number of dies of the flash memory module 130. The processor 111 provided in an embodiment of the disclosure may obtain the writing speed from a default value stored in the storage controller 110, e.g., 1000 MB/s. In another embodiment, the user may also input the minimum sequential writing speed that is acceptable to the user through application software. For instance, if the user enters the minimum acceptable sequential writing speed of 650 MB/s, and the capacity of the flash memory module 130 is 1 TB, then the processor 111 may, from Table 1, find the writing speed of 687 MB/s greater than 650 MB/s and closest to 650 MB/s and the corresponding y=0.625. Therefore, the processor 111 selects 16*0.625=10 dies from the 16 dies of the 1 TB flash memory module 130, so as to write data in the pSLC mode. Thereby, the time of good experience of a user may be increased to 2.9 times. The above information of "increasing the time of good experience of the user to 2.9 times" may also be displayed on the application software after the user enters the writing speed of 650 MB/s.

To sum up, in the data writing method and the storage controller provided in one or more embodiments of the disclosure, the first dies and the second dies are selected from the dies of the flash memory module, and the write data are written in the pSLC mode into the second dies when the amount of the write data is greater than the threshold. In comparison with writing in the pSLC mode the write data into all of the dies of the flash memory module, in the data writing method and the storage controller provided in one or more embodiments of the disclosure, the writing operation in the pSLC mode is performed on the second dies of the flash memory module, so as to increase the good experience time of the user.

It will be apparent to those skilled in the art that various modifications and variations can be made to the disclosed

TABLE I

| y | 0.125 | 0.25 | 0.375 | 0.5 | 0.625 | 0.75 | 0.875 |
|---|---|---|---|---|---|---|---|
| ExT | 1.151 | 1.356 | 1.649 | 2.105 | 2.909 | 4.706 | 12.308 |
| 512 GB Sequential writing | 868 | 737 | 606 | 475 | 343 | 212 | 81 |
| 1 TB Sequential writing | 1737 | 1475 | 1212 | 950 | 687 | 425 | 162 |
| 2 TB Sequential writing | 3500 | 2950 | 2425 | 1900 | 1375 | 850 | 325 |

Note that the writing speed in the pSLC mode by all dies of the flash memory module 130 of 512 GB, 1 TB, and 2 TB is 1000 MB/s, 2000 MB/s, and 3500 MB/s, respectively.

Figure 3:
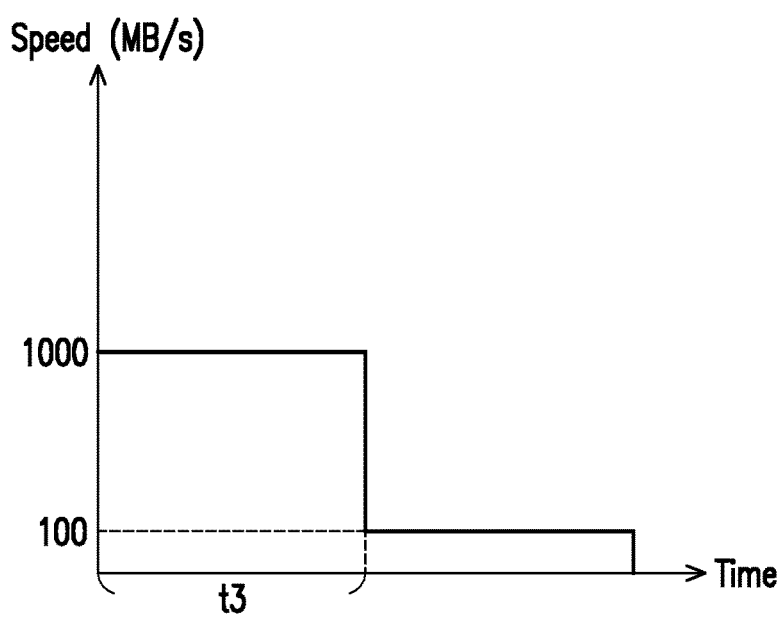
FIG. 3 is a schematic diagram a continuous writing speed and a time when some dies of a flash memory module are configured to be pSLCs according to an embodiment of the disclosure.

FIG. 3 is a schematic diagram of a continuous writing speed and a time when some dies of a flash memory module are configured to be pSLCs according to an embodiment of the disclosure. With reference to FIG. 3 and Table 1, taking "1 TB sequential writing" and "y=0.5" for example, although the writing speed in a time interval t3 is only about 1000 MB/s (e.g., 950 in Table 1), the time interval t3 (e.g., 2.105 in Table) of the good experience time of the user is about twice the time interval t1 in FIG. 2, and the writing speed of 2000 MB/s and the writing speed of 1000 MB/s are insensitive to the user. Accordingly, the good experience time of the user may be effectively extended.

embodiments without departing from the scope or spirit of the disclosure. In view of the foregoing, it is intended that the disclosure covers modifications and variations provided that they fall within the scope of the following claims and their equivalents.

What is claimed is:

1. A data writing method, comprising:
   selecting a plurality of first dies and a plurality of second dies from a plurality of dies of a flash memory module;
   receiving a writing command and determining an amount of write data corresponding to the writing command; and
   when the amount of write data is greater than a threshold, writing in a pseudo single level cell mode the write data into the second dies.

2. The data writing method according to claim 1, wherein when the amount of write data is less than or equal to the threshold, the write data are written in the pseudo single level cell mode into the first dies and the second dies.

3. The data writing method according to claim 1, further comprising:
obtaining a writing speed; and
determining the number of the first dies and the number of the second dies according to the writing speed, a capacity of the flash memory module, and the number of the dies.

4. The data writing method according to claim 1, wherein when pseudo single level cell space corresponding to the second dies is filled with one portion of the write data, the other portion of the write data is written in a non-single level cell mode into storage space other than the pseudo single level cell space in the second dies.

5. The data writing method according to claim 4, wherein the non-single level cell mode comprises a multiple level cell mode, a triple level cell mode, and a quad level cell mode.

6. A storage controller, coupled to a host and a flash memory module and comprising:
a processor, wherein the processor selects a plurality of first dies and a plurality of second dies from a plurality of dies of the flash memory module,
receives a writing command from the host and determines an amount of write data corresponding to the writing command, and
when the amount of write data is greater than a threshold, the processor writes in a pseudo single level cell mode the write data into the second dies.

7. The storage controller according to claim 6, wherein when the amount of write data is less than or equal to the threshold, the processor writes in the pseudo single level cell mode the write data into the first dies and the second dies.

8. The storage controller according to claim 6, wherein the processor obtains a writing speed and determines the number of first dies and the number of second dies according to the writing speed, a capacity of the flash memory module, and the number of the dies.

9. The storage controller according to claim 6, wherein when pseudo single level cell space corresponding to the second dies is filled with one portion of the write data, the processor writes in a non-single level cell mode the other portion of the write data into storage space other than the pseudo single level cell space in the second dies.

10. The storage controller according to claim 9, wherein the non-single level cell mode comprises a multiple level cell mode, a triple level cell mode, and a quad level cell mode.

* * * * *